United States Patent
Lee et al.

(10) Patent No.: US 12,245,468 B2
(45) Date of Patent: Mar. 4, 2025

(54) OPTICAL FILM, DISPLAY DEVICE INCLUDING OPTICAL FILM AND MANUFACTURING METHOD OF OPTICAL FILM

(71) Applicants: Samsung Display Co., Ltd., Yongin-Si (KR); Postech Research and Business Development Foundation, Pohang-si (KR)

(72) Inventors: Jiwon Lee, Hwaseong-si (KR); Sujung Huh, Yongin-si (KR); Joon Hak Oh, Pohang-si (KR); Yoon Ho Lee, Pohang-si (KR); Jiyeon Seo, Hwaseong-si (KR); Youngsang Ha, Suwon-si (KR)

(73) Assignees: SAMSUNG DISPLAY CO., LTD, Gyeonggi-Do (KR); POSTECH RESEARCH AND BUSINESS DEVELOPMENT FOUNDATION, Gyeongsangbuk-Do (KR)

( * ) Notice: Subject to any disclaimer, the term of this patent is extended or adjusted under 35 U.S.C. 154(b) by 601 days.

(21) Appl. No.: 17/191,990

(22) Filed: Mar. 4, 2021

(65) Prior Publication Data
US 2021/0351254 A1 Nov. 11, 2021

(30) Foreign Application Priority Data
May 6, 2020 (KR) .......................... 10-2020-0054087

(51) Int. Cl.
*G02B 1/111* (2015.01)
*B32B 9/04* (2006.01)
(Continued)

(52) U.S. Cl.
CPC ........... *H10K 59/124* (2023.02); *B32B 9/045* (2013.01); *G02B 1/04* (2013.01); *G02B 1/111* (2013.01);
(Continued)

(58) Field of Classification Search
CPC ........... G02B 1/04; G02B 1/111; G02B 1/116; G02B 3/00; G02B 30/27; B32B 2312/00; B32B 2333/12
(Continued)

(56) References Cited

U.S. PATENT DOCUMENTS

| | | | |
|---|---|---|---|
| 7,820,281 | B2 | 10/2010 | Tsuyumoto et al. |
| 8,550,667 | B2 | 10/2013 | Kim et al. |

(Continued)

FOREIGN PATENT DOCUMENTS

| | | |
|---|---|---|
| JP | 2008216971 A | 9/2008 |
| KR | 1020050086503 A | 8/2005 |

(Continued)

OTHER PUBLICATIONS

Suresh Kumar Dhungel et al., "Double-Layer Antireflection Coating of MgF2/SiNx for Crystalline Silicon Solar Cells," Journal of the Korean Physical Society, Sep. 2006, pp. 885-889, vol. 49, No. 3.

*Primary Examiner* — Ruiyun Zhang
(74) *Attorney, Agent, or Firm* — CANTOR COLBURN LLP (57) ABSTRACT

A display device includes a display panel which contains an LED which emits light, a first layer containing a porous polymer and disposed on the display panel, a second layer containing a metal halide and disposed on the first layer, and a lenticular lens disposed on the display panel, where the first layer has a first refractive index and the second layer has a second refractive index less than the first refractive index.

18 Claims, 10 Drawing Sheets

(51) Int. Cl.
*G02B 1/04* (2006.01)
*G02B 1/116* (2015.01)
*G02B 3/00* (2006.01)
*H10K 59/124* (2023.01)

(52) U.S. Cl.
CPC ............... *G02B 1/116* (2013.01); *G02B 3/00* (2013.01); *B32B 2311/00* (2013.01); *B32B 2313/00* (2013.01); *B32B 2333/12* (2013.01); *B32B 2369/00* (2013.01); *B32B 2383/00* (2013.01); *B32B 2457/20* (2013.01); *G02B 2003/0093* (2013.01)

(58) Field of Classification Search
USPC .......................................................... 257/98
See application file for complete search history.

(56) References Cited

U.S. PATENT DOCUMENTS

| | | | |
|---|---|---|---|
| 10,222,510 B2 | 3/2019 | Song et al. | |
| 10,234,599 B2 | 3/2019 | Byun et al. | |
| 10,690,810 B2 | 6/2020 | Chang et al. | |
| 2005/0106377 A1* | 5/2005 | Koestner | C08J 7/046 428/319.3 |
| 2005/0249944 A1* | 11/2005 | Wang | G02B 1/14 428/522 |
| 2008/0192356 A1* | 8/2008 | Hamagishi | G02B 30/27 359/619 |
| 2010/0110551 A1 | 5/2010 | Amansky et al. | |
| 2020/0033506 A1 | 1/2020 | Hichiri et al. | |

FOREIGN PATENT DOCUMENTS

| | | |
|---|---|---|
| KR | 101156436 B1 | 6/2012 |
| KR | 101678704 B1 | 11/2016 |
| KR | 1020190043516 A | 4/2019 |
| KR | 101953776 B1 | 5/2019 |
| KR | 1020190053920 A | 5/2019 |
| KR | 102105118 B1 | 4/2020 |
| WO | 2017043948 A1 | 3/2017 |

\* cited by examiner

FIG. 10

OPTICAL FILM, DISPLAY DEVICE INCLUDING OPTICAL FILM AND MANUFACTURING METHOD OF OPTICAL FILM

This application claims priority to Korean Patent Application No. 10-2020-0054087, filed on May 6, 2020, and all the benefits accruing therefrom under 35 U.S.C. § 119, the content of which in its entirety is herein incorporated by reference.

BACKGROUND

The present disclosure relates to a three-dimensional image display device, and specifically to a three-dimensional image display device with improved transmittance of light emitted from a light emitting element in the display device, and an optical film with improved transmittance.

Various display devices, such as televisions, mobile phones, tablet computes, navigation devices, and game machines, used in multimedia devices, allow light emitted from light emitting elements to be transmitted through windows and thus supply a user with images.

A user's demand for a display device which may implement three-dimensional images is increased in order to make the display device to have cubic effects and display more realistic image, and commercialization of three-dimensional image display devices is in progress.

Particularly, studies are being conducted on a three-dimensional image display device which has a refractive layer capable of improving transmittance in order to minimize external light reflection while retaining the clarity of images.

SUMMARY

The present disclosure provides a display device with improved image visibility and emission efficiency.

The present disclosure also provides an optical film having increased light transmittance.

The present disclosure also provides an optical film manufacturing method with which an optical film having increased light transmittance is provided.

An embodiment of the inventive concept provides a display device including: a display panel including a light-emitting element configured to emit light; a first layer including a porous polymer and disposed on the display panel; a second layer including a metal halide and disposed on the first layer; and a lenticular lens disposed on the display panel, wherein the first layer has a first refractive index and the second layer has a second refractive index less than the first refractive index.

In an embodiment, the porous polymer may include a plurality of pores, and each of the plurality of pores may have a diameter of about 500 to about 1000 nanometers (nm).

In an embodiment, the second layer may have a thickness of about 100 to about 200 nm.

In an embodiment, the first layer may include any one of polycarbonate, polymethyl methacrylate or polysiloxane.

In an embodiment, the second layer may include at least one of $MgF_2$ or $SiO_2$.

In an embodiment, the second layer may be in contact with the first layer.

In an embodiment, the first layer may have a transmittance of at least about 92 percentages (%) in a wavelength range of about 400 to about 700 nm.

In an embodiment, the lenticular lens may be disposed on the second layer.

In an embodiment, the lenticular lens may be disposed between the display panel and the first layer.

In an embodiment of the inventive concept, an optical film includes: a first layer including a porous polymer; and a second layer including a metal halide and disposed on the first layer, wherein the first layer has a first refractive index and the second layer has a second refractive index less than the first refractive index.

In an embodiment, the porous polymer may have pores and the pores may have a diameter of about 500 to about 1000 nm.

In an embodiment, the second layer may have a thickness of about 100 to about 200 nm.

In an embodiment, the first layer may contain any one of polycarbonate, polymethyl methacrylate or polysiloxane.

In an embodiment, the second layer may include at least one of $MgF_2$ or $SiO_2$.

In an embodiment, the second layer may be in contact with the first layer.

In an embodiment of the inventive concept, a method for manufacturing an optical film includes: preparing a base substrate; producing a first solution by mixing a polymer, a non-solvent and a solvent; coating the base substrate with the first solution; removing the non-solvent from the first solution to form a first layer containing a porous polymer; and forming, on the first layer, a second layer containing a metal halide.

In an embodiment, the concentration of the non-solvent in the first solution may be about 1 volume percentages (vol %) to about 4 vol %.

In an embodiment, the polymer may include any one of polycarbonate, polymethyl methacrylate or polysiloxane.

In an embodiment, the metal halide may be $MgF_2$.

In an embodiment, the non-solvent may include methanol, cyclohexane or nonane.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

In the present disclosure, it will be understood that when an element (or area, layer, part) is referred to as being "on", "connected to" or "coupled to" another element, it can be directly on, connected or coupled to the other element, or a third elements may be disposed between them.

Like numbers refer to like elements throughout. Also, in the figures, the thickness, the ratio and the dimension of the element are exaggerated for effective description of the technical contents. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." The term "and/or" includes any and all combinations of one or more of the associated listed items.

It will be understood that, although the terms first, second, etc. may be used herein to describe various elements, these elements should not be limited by these terms. These terms are only used to distinguish one element from another element. For example, a first element could be termed a second element without departing from the teachings of the present invention, similarly a second element could be termed a first element. The singular forms are intended to include the plural forms as well, unless the context clearly indicates otherwise.

The terms, such as "below", "lower", "above", "upper", may be used to describe one element or feature's relationship to another element(s) or feature(s) as illustrated in the figures. The terms are such relative concepts that they may be used to explain with the orientation depicted in the figures.

It should be further understood that the terms "comprises", "includes" or "have", when used in this specification, are intended to specify the presence of stated features, integers, steps, operations, elements, components, or components thereof, but do not exclude the probability of the presence or addition of one or more other features, integers, steps, operations, elements, components, or combinations thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will be interpreted in an idealized or overly formal sense unless expressly so defined herein.

Hereinafter, embodiments of the inventive concept will be described with reference to the accompanying drawings.

Figure 1:
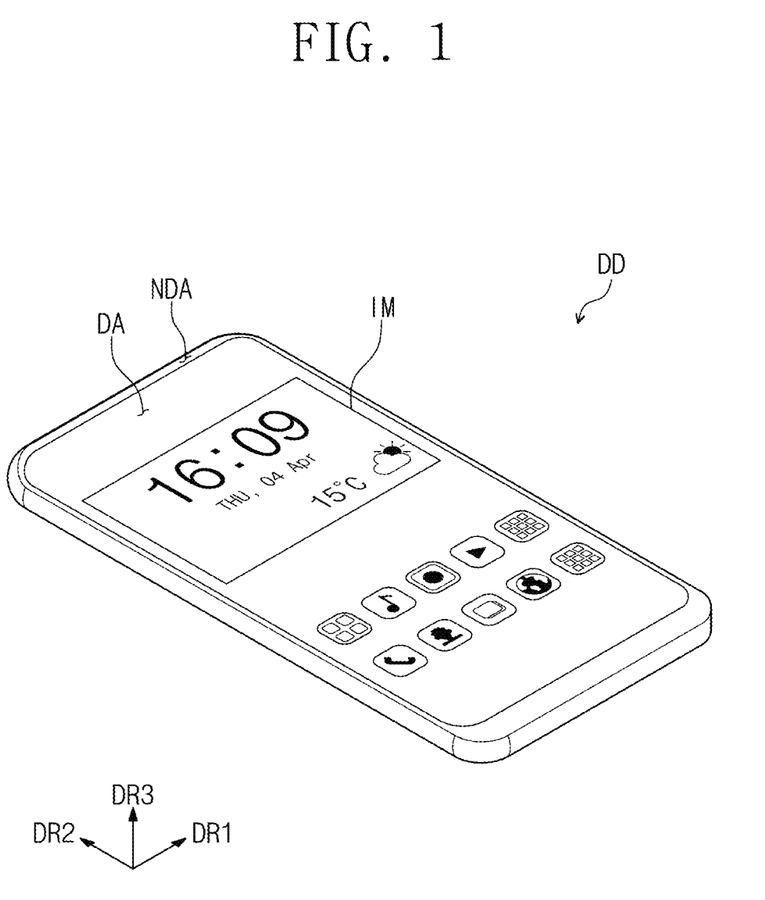
FIG. 1 exemplarily illustrates a perspective view of a display device according to an embodiment of the inventive concept.
Figure 2:
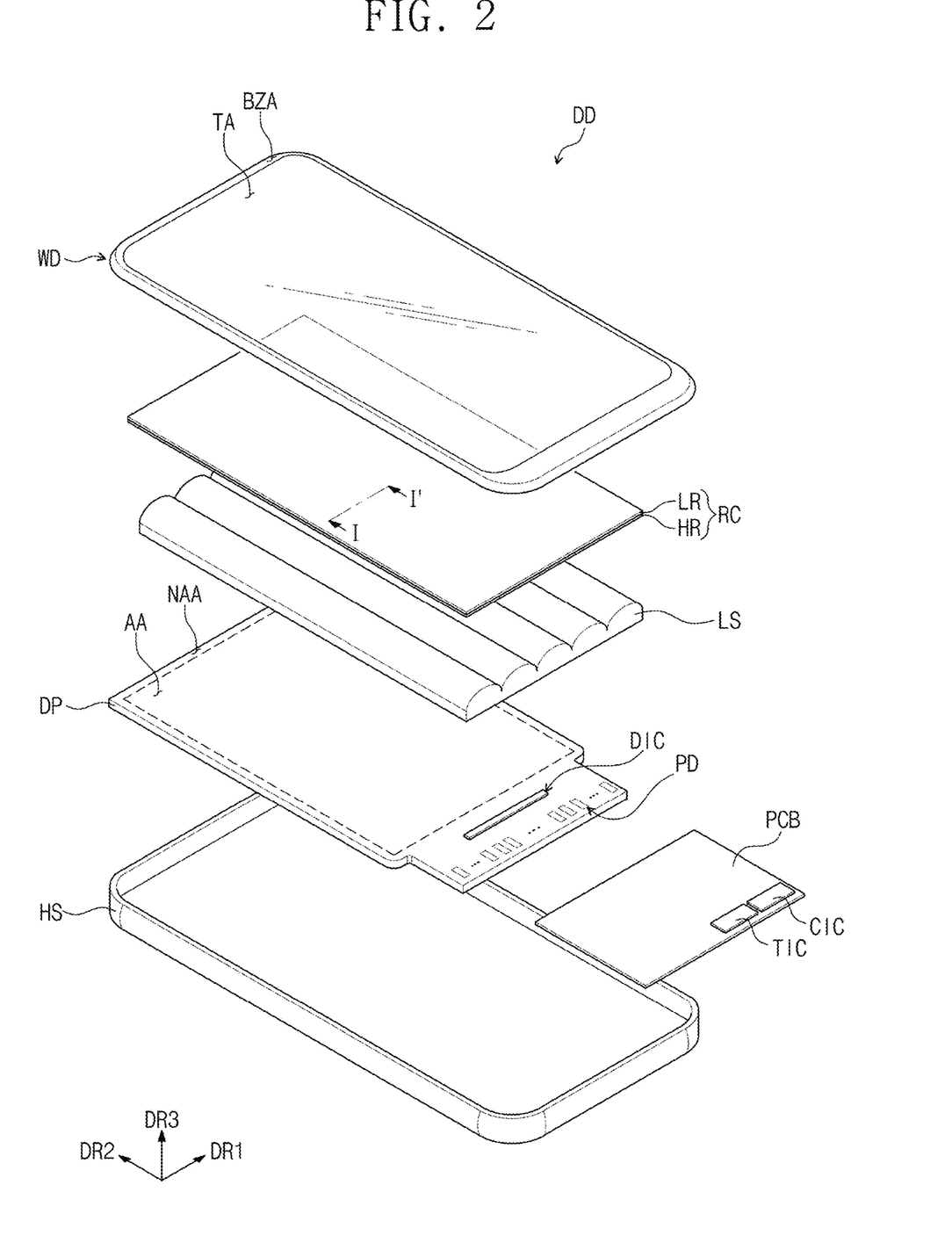
FIG. 2 exemplarily illustrates an exploded perspective view of a display device according to an embodiment of the inventive concept.
Figure 3:
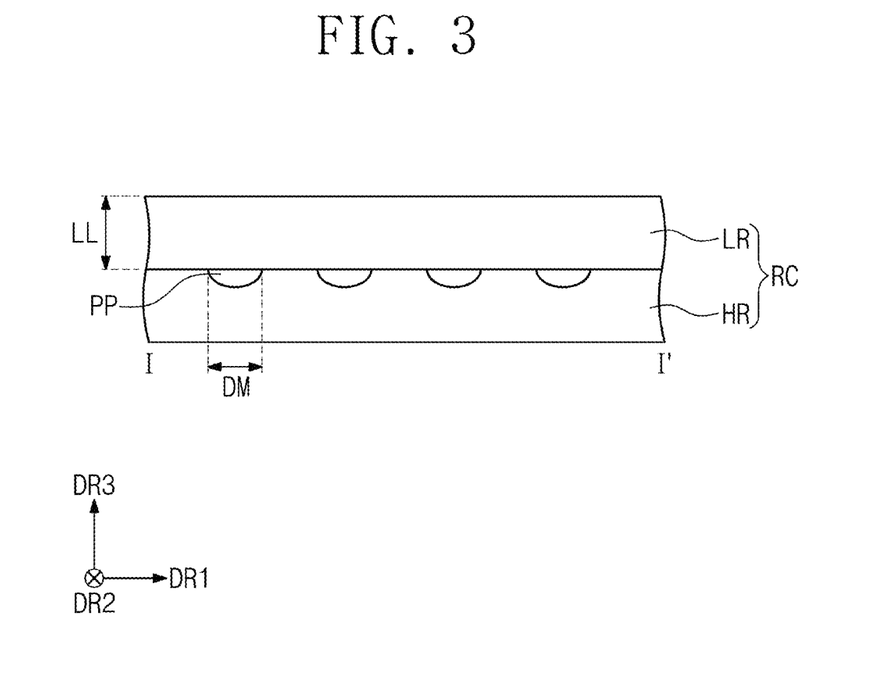
FIG. 3 exemplarily illustrates a cross-sectional view taken along I-I' of FIG. 2.
Figure 4:
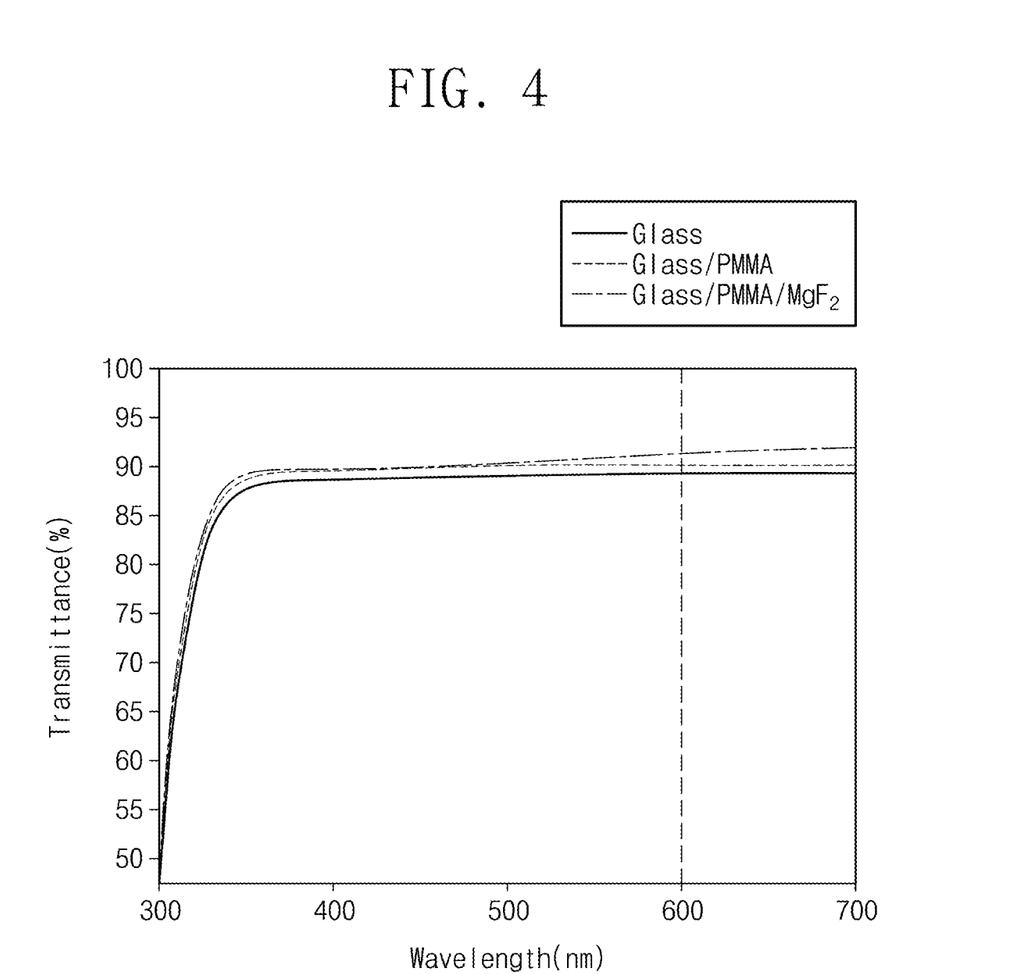
FIGS. 4 and 5 are graphs showing the transmittance of an optical film according to an embodiment.
Figure 5:
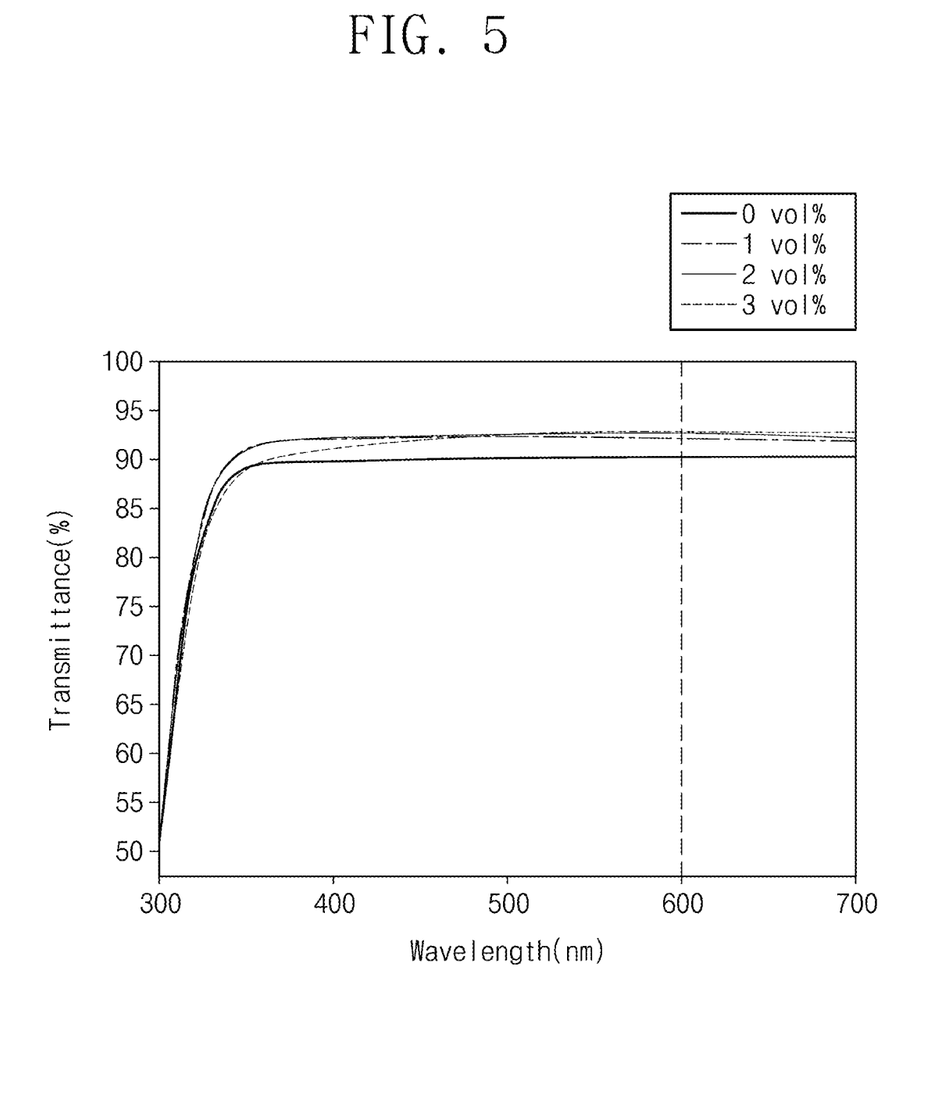

FIG. 1 exemplarily illustrates a perspective view of a display device DD according to an embodiment of the inventive concept. FIG. 2 exemplarily illustrates an exploded perspective view of the display device DD according to an embodiment of the inventive concept. FIG. 3 exemplarily illustrates a cross-sectional view taken along I-I' of FIG. 2. FIGS. 4 and 5 are graphs showing the transmittance of an optical film according to an embodiment.

FIG. 1 exemplarily illustrates a display device DD adopted in a smartphone. The display device DD may be used, although not limited to, small- and medium-sized electronic devices such as mobile phones, tablets, car navigations, game machines or smart watches, as well as large electronic devices such as televisions or monitors.

In the present disclosure, a smartphone may be a display device DD which implement three-dimensional images. In other words, the display device DD according to an embodiment of the inventive concept may provide a user with a three-dimensional image. There are a glasses-adopting method and a glasses-free method as a method for realizing three-dimensional images. Hereinafter, a display device which implements three-dimensional images in a glasses-free manner will be described. A glasses-free three-dimensional image display device provides a user with three-dimensional images by achieving images corresponding to multiple viewpoints, using a lenticular lens or arallax barrier. A display area DA and a non-display area NDA may be defined in the display device DD. The display area DA is an area in which three-dimensional images are implemented. That is, the display area DA is an area in which an image IM is displayed A first direction DR1 is a direction along which a short side of the display device DD extends, and a second direction DR2 is a direction along which a long side of the display device DD extends. The display area DA may be parallel to a plane defined by the first direction DR1 and the second direction DR2 as shown in FIG. 1. A normal direction of the display area DA, that is, a thickness direction of the display device DD indicates a third direction DR3. A front side (or an upper side) and a back side (or a lower side) of each member are distinguished according to the third direction DR3. However, directions indicated by the first to third directions are relative concepts and may thus be changed to other directions. Hereinafter, first to third directions are directions respectively indicated by the first to third directions DR1, DR2, and DR3, and denoted as the like reference numerals or symbols.

The shape of the display area DA illustrated in FIG. 1 is an example, and the shape of the display area DA may be changed in another embodiment. The non-display area NDA is adjacent to the display area DA and is an area in which an image IM is not displayed. A bezel area of the display device DD may be defined by the non-display area NDA. The non-display area NDA may surround the display area DA. However, the embodiment of the inventive concept is not limited thereto, and the shape of the display area DA and the non-display area NDA may be changed in another embodiment.

Referring to FIG. 2, the display device DD may include a window WD, an optical film RC, a lenticular lens LS, a display panel DP, a printing circuit board PCB, a control drive circuit CIC and a housing HS.

In an embodiment, the window WD may be disposed on the display panel DP. Components inside the display device DD may be protected from external shock by the window WD. A transmission area TA and a bezel area BZA may be defined in the window WD. The transmission area TA may be an area in which incident light is transmitted. Specifically, light generated from the display panel DP may pass through the transmission area TA and an image composed of the the passed light may be visible to a user. In an embodiment, the transmission area TA may be overlapped with the display area DA in a plan view (i.e., view in the third direction DR3).

The bezel area BZA may be adjacent to the transmission area TA. Specifically, the bezel area BZA may surround the transmission area TA. In an embodiment of the inventive concept, the bezel area BZA may have a predetermined color. The bezel area BZA may be overlapped with the non-display area NDA in a plan view.

The display panel DP may generate an image and provide the generated image in the third direction DR3. In the display device DD of an embodiment, the display panel DP may be a light emitting display panel. For example, the display panel DP may be a micro light emitting diode ("micro-LED") display panel, an organic electroluminescence display panel or a quantum dot light emitting display panel. In the present disclosure, description is given based on an organic electroluminescence display panel. However, the embodiments of the inventive concept are not limited thereto.

The display panel DP may be a rigid display panel. Alternatively, in an embodiment, the display panel DP may be a flexible display panel. The display panel DP may include a flexible substrate. The term 'flexible' herein means a bendability, and is not limited to a structure of being completely folded, but may include a structure of being bent by a degree of several nanometers.

An active area AA and a non-active area NAA may be defined in the display panel DP. The active area AA is an area corresponding to the display area DA of FIG. 1, and may show an image IM and detect a user's input.

The non-active area NAA is an area corresponding to the non-display area NDA, and may provide the active area AA with an electrical signal. Electrical wires for receiving electrical signals from the active area AA may be disposed in the non-active area NAA.

Besides, the display panel DP may include a base substrate (not shown), a circuit layer (not shown), a light-emitting element layer (not shown) and an encapsulation layer (not shown). The base substrate may provide a base surface on which other parts of the display panel DP are disposed. The circuit layer includes a pixel driving circuit and signal lines. For example, the circuit layer may include a plurality of transistors, capacitors and lines. The light-emitting element layer is disposed on the circuit layer and may include light-emitting elements connected to a plurality of transistors. In the light-emitting element layer, pixels are arranged in a matrix form. The display panel DP may generate an image by light emitted from the light-emitting elements of the light-emitting element layer. The encapsulation layer is disposed on the light-emitting element layer, and may encapsulate the light-emitting element layer and protect the light-emitting element layer from impurities.

Although not shown, the display device of an embodiment may further include an input sensor disposed on the display panel DP. Specifically, the input sensor may be disposed on the encapsulation layer of the display panel DP. The input sensor may include a plurality of sensing signals and a plurality of sensing electrodes which may sense user's input.

A control drive circuit CIC and an input sensing drive circuit TIC may be mounted on a printed circuit board PCB. The printed circuit board PCB may be electrically connected to pads PD of the display panel DP. The input sensing drive circuit TIC may sense a change in electrostatic capacitance of an input sensor by using the pads PD. The control drive circuit CIC may control a data drive circuit DIC. The data drive circuit DIC may provide pixels with data signals according to signals received from the control drive circuit CIC.

A housing HS may be disposed under the display panel DP. The housing HS may accommodate a window WD, an optical film RC, a lenticular lens LS, and a display panel DP.

The lenticular lens LS and the optical film RC may be disposed between the display panel DP and the housing HS.

As illustrated in FIG. 2, the optical film RC may be disposed between the lenticular lens LS and the window WD.

The optical film RC may be a refractive index adjustment layer. The optical film RC may include a first layer HR and a second layer LR disposed on the first layer HR. In an embodiment, the second layer LR may be in contact with the first layer HR. As illustrated in FIG. 2, when the optical film RC is disposed on the lenticular lens LS, the first layer HR may be coated on the lenticular lens LS. However, embodiments of the inventive concept are not limited thereto. An optically clear adhesive ("OCA") may be disposed between the second layer LR of the optical film RC and the lenticular lens LS in another embodiment.

Referring to FIG. 3, the first layer HR includes a porous polymer. The porous polymer may include porous polycarbonate, porous polymethyl methacrylate ("PMMA"), and/or porous polysiloxane. For example, the first layer HR may include porous polymethyl methacrylate. The refractive index of the first layer HR may vary from about 1.4 to about 1.49 depending on the constituent of the first layer HR In an embodiment, the porous polymer of the first layer HR may define a plurality of pores PP. The plurality of pores PP may be shaped such that the surface of the porous polymer of the first layer HR is recessed concavely. The diameters DM of the pores PP may each be about 500 to about 1000 nanometers (nm). Although FIG. 3 exemplarily illustrates that the plurality of pores PP each have a particular shape, the embodiments of the inventive concept is not limited thereto. Thus, the pores PP may have different sizes and shapes. In an embodiment, when the plurality of pores PP each have an elliptical shape, the diameter DM of each of the pores PP may indicate an average diameter of the pores PP.

In the optical film RC according to an embodiment, the transmittance of visible light may be adjusted according to the diameters DM of the pores PP in the first layer HR. Specifically, the transmittance of visible light passing through the first layer HR may be adjusted according to the diameters DM of the plurality of pores PP. If the diameters DM of the plurality of pores PP increase, the transmittance of light with respect to the first layer HR in a long wavelength range of about 600 nm to about 700 nm may increase. On the contrary, if the diameters DM of the plurality of pores PP decrease, the transmittance of light with respect to the first layer HR in a short wavelength range of about 300 nm to about 400 nm may increase. In other words, in the optical film RC according to an embodiment, the transmittance of light having a specific wavelength with respect to the first layer HR may increase or decrease by adjusting the diameters DM of the plurality of pores PP. In another embodiment, for example, the transmittance of visible light with respect to the first layer HR may be at least about 90 percentages (%). More specifically, the transmittance of light with a wavelength of about 400 nm to about 700 nm is at least about 92%.

The first layer HR has a first refractive index, and the second layer LR has a second refractive index. The first refractive index is greater than the second refractive index. That is, the first layer HR is a higher-refractive layer than the second layer LR, and the second layer LR is a lower-refractive layer than the first layer HR. In the optical film RC, a low-refractive-index layer is disposed on and in contact with a high-refractive-index layer, so that the transmittance of light passing through the optical film RC may be increased or decreased.

In the optical film RC of an embodiment, the transmittance of light having a specific wavelength may be adjusted according to a difference value between the first refractive index and the second refractive index. Specifically, the second refractive index may be adjusted by changing a thickness LL of the second layer LR. For example, the thickness LL of the second layer LR may be about 100 to about 200 nm. The second refractive index may be about 1.35 to about 1.45. In the present disclosure, the thickness LL of the second layer LR may be a length obtained by measuring the second layer LR in the third direction DR3.

In the optical film RC according to an embodiment, the difference value between the first refractive index and the second refractive index may be adjusted by changing the second refractive index. For example, if the thickness LL of the second layer LR increases, the second refractive index may decrease, and the difference value between the first refractive index and the second refractive index may increase. Embodiments of the inventive concept are not limited thereto. According to the thickness LL of the second layer LR, the difference value between the first refractive index and the second refractive index may have various values, which makes it possible to adjust the transmittance of light of the optical film RC in a wide range.

The second layer LR includes a metal halide. The metal halide may be $MgF_2$. However, the embodiments of the inventive concept are not limited thereto. Any material may be used as the metal halide included in the second layer LR without any limitation, as long as the material has a lower refractive index than the first layer HR and may adjust the refractive index according to a wavelength by adjusting the thickness of the second layer LR or by adjusting the diameters DM of the plurality of pores PP. For example, the second layer LR may include $SiO_2$.

FIG. 4 and FIG. 5 are graphs showing the transmittance of the optical film according to an embodiment. More specifically, FIG. 4 and FIG. 5 are graphs illustrating transmittance (%) of the optical film RC versus wavelength (nm) according to several embodiments. FIG. 4 shows the transmittances of visible light as measured in the first case where a glass substrate is placed (hereinafter, Experimental example 1), in the second case where polymethyl methacrylate (hereinafter, PMMA) is placed as a single layer on the glass substrate (hereinafter, Experimental example 2), and in the third case where PMMA and $MgF_2$ are sequentially laminated on the glass substrate (hereinafter, Experimental example 3). The refractive index of the glass substrate is about 1.52, the refractive index of PMMA is about 1.49, and the refractive index of $MgF_2$ is about 1.38. The PMMA layer is obtained by spin-coating, at about 7000 revolutions per minute (rpm) for about 40 seconds, the glass substrate with a solution in which PMMA is present at a concentration of about 10 milligrams per milliliter (mg/ml) in chloroform, and $MgF_2$ is deposited onto the PMMA to have a thickness of 100 nm.

Referring to the graph in FIG. 4, it may be confirmed that in the entire visible light range (i.e., about 300 to 700 nm), the transmittances of Experimental examples 2 and 3 are greater than that of Experimental example 1. In other words, it may be seen that the display device including the PMMA layer has a more improved emission efficiency of a light emitting element than the display device which does not include the PMMA layer.

From FIG. 4, it may be observed that the transmittance is further improved in the order of Experimental example 1, 2 and 3 in a long wavelength range of at least about 500 nm. Specifically, for example, light with a wavelength of about 600 nm shows a transmittance of about 89% in Experimental example 1, a transmittance of about 90% in Experimental example 2, and a transmittance of about 91% in Experimental example 3. That is, when $MgF_2$ is deposited onto the PMMA to have a thickness of about 100 nm, it may be demonstrated that transmittance is improved even in a long wavelength range.

Comparing Experimental example 2 with Experimental example 3 may show that the case in which $MgF_2$ having a lower refractive index than PMMA is deposited on the PMMA (i.e., Experimental example 3) has more improved transmittance than the case in which only PMMA is deposited on a glass substrate (i.e., Experimental example 2).

FIG. 5 shows the transmittance of visible light as measured in the case where a glass substrate is placed and a porous polymethyl methacrylate (hereinafter, porous PMMA) is placed on the glass substrate.

The porous PMMA was prepared using 10 mg/ml nonane, which is a non-solvent, and the concentration of nonane was adjusted to about 1 volume percentages (vol %), about 2 vol % and about 3 vol %. The diameters DM of a plurality of pores in the porous PMMA were increased as the concentration of nonane was increased.

Referring to the graph shown in FIG. 5, the transmittance was improved more in the porous PMMA than in PMMA which does not have protrusion-and-recesses on the surface thereof. The transmittance of a PMMA single layer without the pores in FIG. 4 was about 90% or less, whereas the transmittance of the optical film including porous PMMA in FIG. 5 was increased to at least about 92% in a long wavelength of about 500 to about 700 nm.

Also, referring to the graph in FIG. 5, it may be seen that the transmittance of light increases as the concentration of nonane increases. Specifically, for example, light having a wavelength of about 600 nm shows a transmittance of about 93% at a nonane concentration of about 2 vol %.

When the graph of Experimental example 2 in FIG. 4 is compared with the graph in FIG. 5 with a nonane concentration of about 2 vol %, it may be seen that the transmittance in a long wavelength range becomes higher in the case where the porous PMMA is formed as a single layer (i.e., 2 vol % case) than in the case where the PMMA without pores is formed as a single layer on the glass substrate (Experimental example 1).

Specifically, light having a wavelength of about 600 nm has a transmittance of about 90% when the glass substrate is coated with non-porous PMMA, and a transmittance of about 93% when the glass substrate is coated with a porous PMMA. Thus, it may be seen that the emission efficiency and the visibility may be more improved in the display device including the porous PMMA layer than in the display device including the PMMA layer which does not have protrusions-and-recesses on the surface thereof. Furthermore, referring to the results from Experimental examples 2 and 3 in FIG. 4, it is expected that light having a wavelength range of about 600 nm shows a transmittance of at least about 93% if $MgF_2$ is arranged instead of the porous PMMA layer in FIG. 5.

Figure 6:
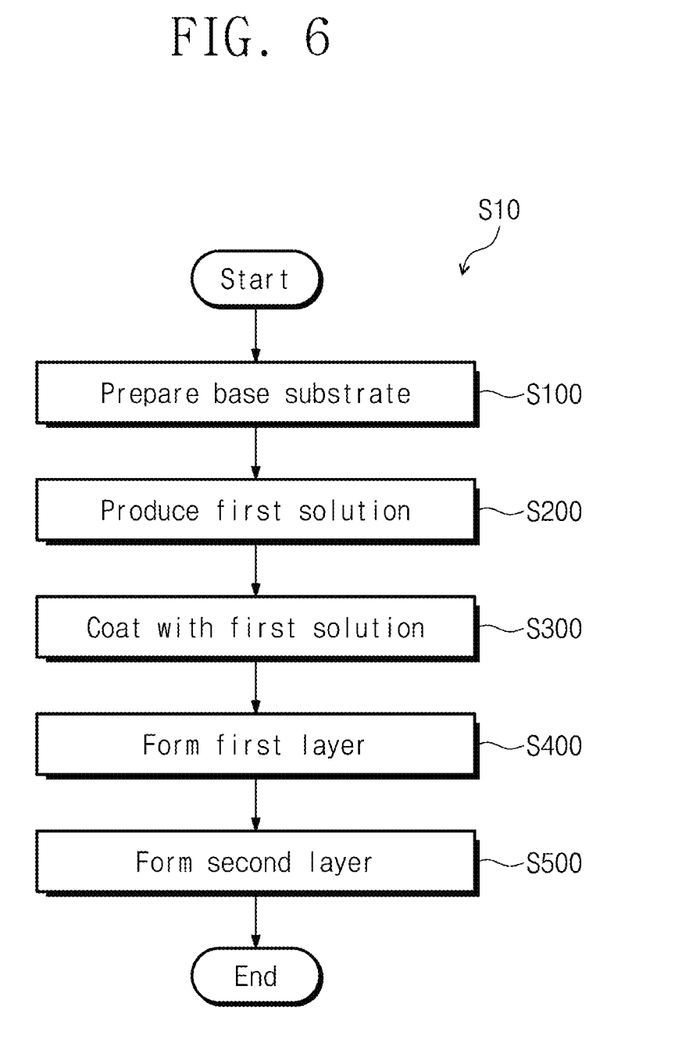
FIG. 6 is a flowchart showing a method for manufacturing an optical film according to an embodiment of the inventive concept.
Figure 7:
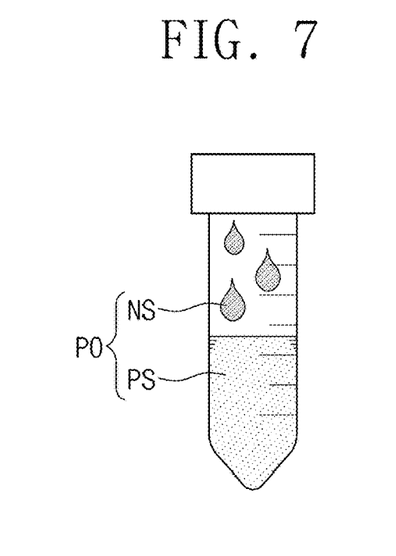
FIG. 7 exemplarily illustrates operations of a method for manufacturing an optical film according to an embodiment of the inventive concept.
Figure 8:
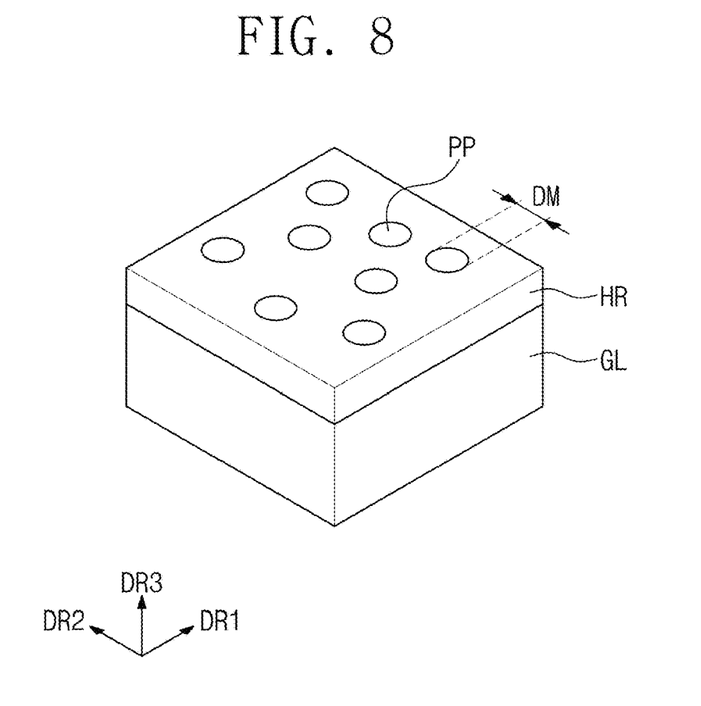
FIG. 8 exemplarily illustrates operations of a method for manufacturing an optical film according to an embodiment of the inventive concept.

FIG. 6 is a flowchart illustrating a method for preparing an optical film RC according to an embodiment of the inventive concept. FIGS. 7, 8 and 10 are schematic diagrams sequentially illustrating operations of a method for preparing an optical film RC according to an embodiment of the inventive concept. FIGS. 9A to 9D are images of a first layer HR according to an embodiment of the inventive concept.

According to FIG. 6, a method S10 for preparing an optical film RC according to an embodiment of the inventive concept includes an operation S100 for preparing a base substrate GL, an operation S200 for preparing a first solution PO, an operation S300 for coating with the first solution PO, an operation S400 for forming a first layer HR and an operation S500 for forming a second layer LR.

Specifically, in the operation S100 for preparing a base substrate GL, the base substrate GL may be a glass substrate. However, embodiments of the inventive concept are not limited thereto.

Referring to FIG. 7, the operation S200 for preparing the first solution PO may be an operation for preparing the first solution PO in which a non-solvent NS is added to a preparation solution PS obtained by solving a polymer in a solvent. The solvent of the preparation solution PS may be chloroform. The polymer may be polymethyl methacrylate (hereinafter, PMMA). The PMMA may be solved at a concentration of about 10 mg/ml in a solvent. The non-solvent NS may be an aliphatic hydrocarbon. Specifically, the non-solvent NS may be methanol, cyclohexanol, and/or nonane. For example, the non-solvent NS may be nonane. The nonane may be mixed but not be solved in the preparation solution PS. However, embodiments of the inventive concept are not limited thereto.

Referring to FIG. 8, the operation S300 for coating with the first solution PO may be an operation for coating the base substrate GL with the first solution PO and then drying. Specifically, the operation for coating the base substrate GL with the first solution PO may be performed through a process such as spin coating, slit coating, bar coating or inkjet printing. For example, the first solution PO may be applied through a spin coating process.

The operation S400 for forming the first layer HR may be an operation for drying the first solution PO with which the base substrate GL has been coated. When the first solution PO is dried, the non-solvent NS mixed in the first solution PO may be removed, and a plurality of pores may be formed at sites where the non-solvent NS was present. In other words, the first layer HR may be a layer in which protrusions-and-recesses are formed on the surface of a polymer.

The diameters DM of the plurality of pores PP may be adjusted by adjusting the concentration of nonane in the first solution PO. For example, as the concentration of nonane increases, the diameters of the plurality of pores may increase. FIGS. 9A to 9D are scanning electron microscopic images of pores defined in the first layer HR when the concentration of nonane in the first solution PO is about 0 vol %, about 1 vol %, about 2 vol % and about 3 vol %.

Figure 9A:
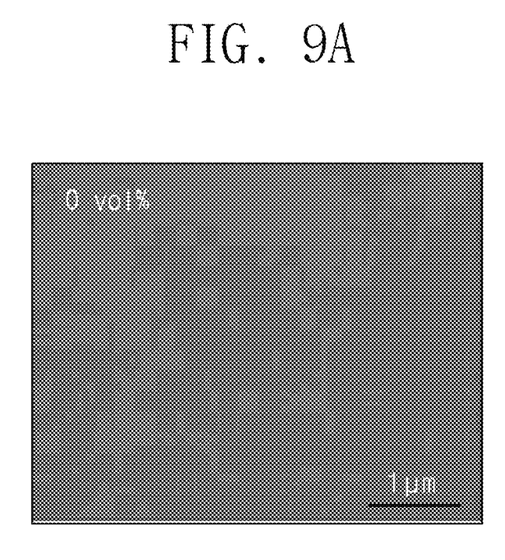
FIGS. 9A to 9D are images showing a cross-sectional view of a first layer according to an embodiment of the inventive concept.
Figure 9B:
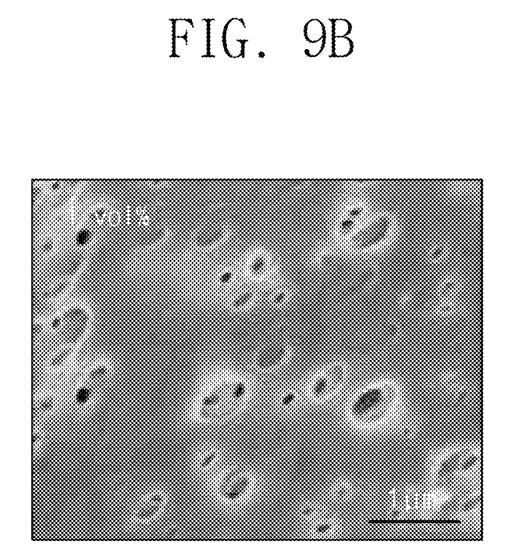
Figure 9C:
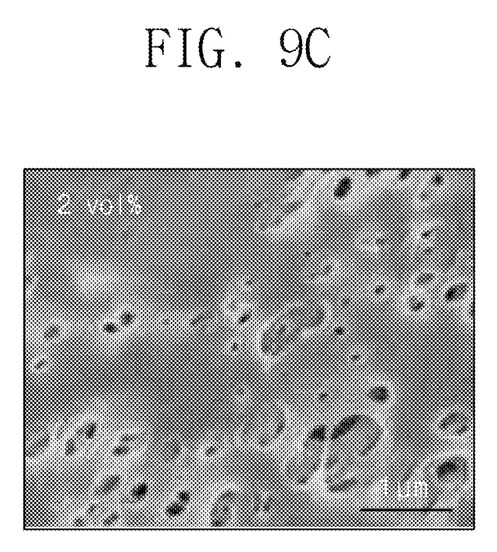
Figure 9D:
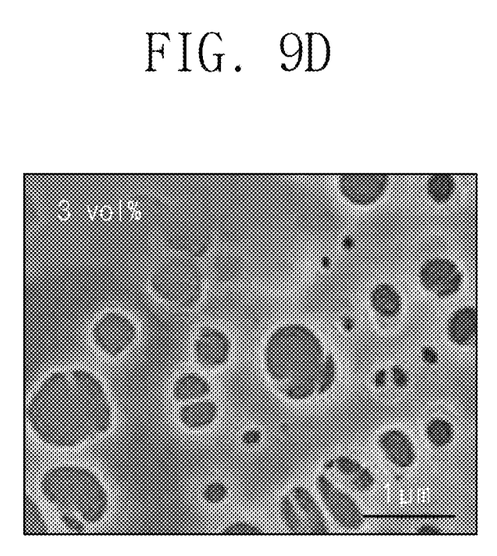
Figure 10:
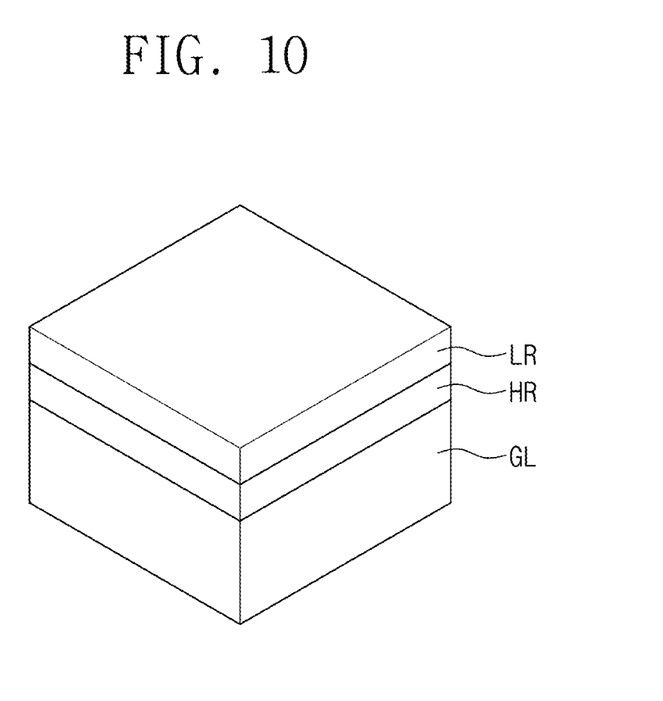
FIG. 10 exemplarily illustrates operations of a method for manufacturing an optical film according to an embodiment of the inventive concept.

Referring to FIG. 9A, when the nonane is about 0 vol %, pores may not be formed in the first layer HR, and a polymer layer having no protrusion-and-recess may be formed. Referring to FIGS. 9B and 9C, it may be seen that as the concentration of nonane increases, the diameters DM of the plurality of pores PP increase, respectively. As stated above, as the diameter DM is greater, the transmittance in a long wavelength range of about 600 to about 700 nm may become higher; and as the diameter DM is smaller, the transmittance in a short wavelength range may become higher.

The operation S500 for forming the second layer LR is an operation for depositing a metal halide on the first layer HR. In an embodiment, the metal halide may be $MgF_2$. The second layer LR may have a thickness LL of about 100 to about 200 nm. As stated previously, a second refractive index may be adjusted by adjusting the thickness of the second layer LR.

A method for preparing an optical film RC according to an embodiment of the inventive concept includes an operation S100 for preparing a base substrate GL, an operation S200 for preparing a first solution PO, an operation S300 for coating with the first solution PO, an operation S400 for forming a first layer HR and an operation S500 for forming a second layer LR, and may thus provide an optical film with improved light transmittance. A display device, in which the optical film of an embodiment is used, may improve emission efficiency and visibility, and reduce reflection of external light to a user.

A display device according to an exemplary embodiment of the inventive concept may improve visibility and emission efficiency.

An optical film according to an exemplary embodiment of the inventive concept may increase the transmittance of light.

A method for manufacturing an optical film according to an exemplary embodiment of the inventive concept may provide an optical film having increased light transmittance.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display device comprising:
   a display panel including a light-emitting element configured to emit light;
   a first layer including a porous polymer and disposed on the display panel;
   a second layer including a metal halide and disposed on the first layer; and
   a lenticular lens disposed on the display panel,
   wherein the first layer has a first refractive index and the second layer has a second refractive index less than the first refractive index,
   wherein the porous polymer comprises a plurality of pores having an average diameter of about 900 to about 1000 nanometers (nm), and
   wherein a light transmittance of the first layer is higher in a wavelength of about 700 nm than in a wavelength of about 400 nm.

2. The display device of claim 1, wherein the second layer has a thickness of about 100-200 nm.

3. The display device of claim 1, wherein the first layer comprises any one of polycarbonate, polymethyl methacrylate or polysiloxane.

4. The display device of claim 1, wherein the second layer comprises $MgF_2$.

5. The display device of claim 1, wherein the second layer is in contact with the first layer.

6. The display device of claim 1, wherein the first layer has the light transmittance of at least 92 percentages (%) in a wavelength range of about 400-700 nm.

7. The display device of claim 1, wherein the lenticular lens is disposed on the second layer.

8. The display device of claim 1, wherein the lenticular lens is disposed between the display panel and the first layer.

9. An optical film comprising:
a first layer including a porous polymer; and
a second layer including a metal halide and disposed on the first layer,
wherein the first layer has a first refractive index and the second layer has a second refractive index less than the first refractive index,
wherein the porous polymer comprises a plurality of pores having an average diameter of about 900 to about 1000 nanometers (nm), and
wherein a light transmittance of the first layer is higher in a wavelength of about 700 nm than in a wavelength of about 400 nm.

10. The optical film of claim 9, wherein the second layer has a thickness of about 100-200 nm.

11. The optical film of claim 9, wherein the first layer contains any one of polycarbonate, polymethyl methacrylate or polysiloxane.

12. The optical film of claim 9, wherein the second layer comprises $MgF_2$.

13. The optical film of claim 9, wherein the second layer is in contact with the first layer.

14. An optical film comprising:
a first layer including a porous polymer; and
a second layer including a metal halide and disposed on the first layer,
wherein the first layer has a first refractive index and the second layer has a second refractive index less than the first refractive index,
wherein the porous polymer comprises a plurality of pores having an average diameter of about 500 to about 600 nanometers (nm), and
wherein a light transmittance of the first layer is higher in a wavelength of about 300-400 nm than in a wavelength of about 900-1000 nm.

15. The optical film of claim 14, wherein the second layer has a thickness of about 100-200 nm.

16. The optical film of claim 14, wherein the first layer contains any one of polycarbonate, polymethyl methacrylate or polysiloxane.

17. The optical film of claim 14, wherein the second layer comprises $MgF_2$.

18. The optical film of claim 14, wherein the second layer is in contact with the first layer.

* * * * *